(12) United States Patent
Yamanouchi

(10) Patent No.: US 7,135,805 B2
(45) Date of Patent: Nov. 14, 2006

(54) SURFACE ACOUSTIC WAVE TRANSDUCER

(75) Inventor: Kazuhiko Yamanouchi, 37-13, Matsugaoka, Taihaku-ku, Sendai-shi, Miyagi (JP)

(73) Assignees: Nihon Dempa Kogyo Co., Ltd., Tokyo (JP); Kazuhiko Yamanouchi, Miyagi (JP)

( * ) Notice: Subject to any disclaimer, the term of this patent is extended or adjusted under 35 U.S.C. 154(b) by 64 days.

(21) Appl. No.: 10/819,814

(22) Filed: Apr. 7, 2004

(65) Prior Publication Data
US 2004/0201306 A1    Oct. 14, 2004

(30) Foreign Application Priority Data
Apr. 8, 2003    (JP)    ............... 2003-137987
Jun. 17, 2003    (JP)    ............... 2003-200799

(51) Int. Cl.
H01L 41/08    (2006.01)
(52) U.S. Cl. ............... 310/313 D; 310/313 R
(58) Field of Classification Search ............ 310/313 A, 310/313 B, 313 C, 313 D, 313 R
See application file for complete search history.

(56) References Cited

U.S. PATENT DOCUMENTS

| | | | | |
|---|---|---|---|---|
| 4,097,825 A | * | 6/1978 | Gerard | 333/151 |
| 4,155,057 A | * | 5/1979 | Sandy et al. | 333/195 |
| 4,353,046 A | * | 10/1982 | Hartmann | 333/194 |
| 4,454,488 A | * | 6/1984 | Hartmann | 333/195 |
| 4,635,009 A | * | 1/1987 | Ebata | 333/195 |
| 4,879,487 A | * | 11/1989 | Sugai et al. | 310/313 A |
| 5,051,644 A | * | 9/1991 | Wright | 310/313 B |
| 5,061,871 A | * | 10/1991 | Wright | 310/313 B |
| 5,336,957 A | * | 8/1994 | Yamanouchi et al. | 310/313 D |
| 5,406,159 A | * | 4/1995 | Wright | 310/313 D |
| 5,793,146 A | * | 8/1998 | Wright | 310/313 B |
| 6,373,353 B1 | * | 4/2002 | Takeuchi et al. | 333/193 |
| 6,414,414 B1 | * | 7/2002 | Wright | 310/313 D |

OTHER PUBLICATIONS

C.S. Hartmann et al. "An Analysis of Saw Interdigital Transducers with Internal Reflections and the Application to the Design of Single-Phase Unidirectional Transducers" Proceedings of 1982 Ultrasonic Symposium, pp. 40-45, 1982.

* cited by examiner

*Primary Examiner*—Mark Budd
(74) *Attorney, Agent, or Firm*—Katten Muchin Rosenman LLP

(57) ABSTRACT

A unidirectional surface acoustic wave (SAW) transducer has a substrate which is piezoelectric or electrostrictive, a first IDT (interdigital transducer) electrode disposed on a surface of the substrate and having a plurality of first electrode fingers, and a second IDT electrode disposed on the surface of the substrate and having a plurality of second electrode fingers alternating with the first electrode fingers, and structural elements disposed on the surface of the substrate and arranged periodically in a propagating direction of surface acoustic waves. The structural elements comprise grooves or dielectric films each having a width of $\lambda_0/4$ or $\lambda_0/2$, for example, where $\lambda_0$ represents a wavelength corresponding to a fundamental operating frequency of the unidirectional surface acoustic wave transducer.

16 Claims, 12 Drawing Sheets

SURFACE ACOUSTIC WAVE TRANSDUCER

BACKGROUND OF THE INVENTION

1. Field of the Invention

The present invention relates to a transducer utilizing surface acoustic waves (SAW), and more particularly to a surface acoustic wave transducer where internal reflections and electromechanical coupling constant changes are applied to an interdigital transducer (IDT).

2. Description of the Related Art

Surface acoustic wave transducers which excite and receive surface acoustic waves on a piezoelectric or electrostrictive material are widely used as devices such as bandpass filters. An ordinary surface acoustic wave transducer has electrodes of an IDT structure which are arranged on the surface of a piezoelectric or electrostrictive material. When an AC electric signal is applied between positive and negative electrodes of an IDT on the input side, a surface acoustic wave is excited, The excited surface acoustic wave is propagated to and received by another IDT on the output side. Such a surface acoustic wave transducer is known as a transversal surface acoustic wave filter.

The above surface acoustic wave transducer basically causes a loss of 6 dB because the excited surface acoustic wave is propagated equally in both left and right directions. Heretofore, various surface acoustic wave transducers have been proposed in the art in order to minimize the loss of 6 dB. The proposed surface acoustic wave transducers are generally classified into the following three types:

(a) A three-phase unidirectional device having three IDT electrode fingers (teeth) disposed on its surface, where signals with phase shifts of 0°, 120°, 240° are applied to the respective electrode fingers:

(b) A group-type unidirectional transducer having a meander line extending between ordinary electrode fingers and serving as a ground electrode, where signals having a phase shift of 90° are applied to the respective electrode fingers; and (c) An internal-reflection-type unidirectional transducer having a pair of IDT electrode fingers made of aluminum (Al) and electrode fingers made of a large-density metal such as gold (Au) for reflecting surface acoustic waves, with the distance between a central region where surface acoustic waves are excited and a central region where surface acoustic waves are reflected being set to ⅛ of the wavelength of the excited surface acoustic waves.

In the following description, the wavelength of the excited surface waves is represented by $\lambda_0$.

The three-phase unidirectional transducer at (a) can keep surface acoustic waves propagated in one direction in a wide frequency range. However, since the electrode fingers extending from one of the three bus bars need to extend over another one of the three bus bars, it requires a highly complex process and hence is highly costly to manufacture the three-phase unidirectional transducer. Another problem with the three-phase unidirectional transducer is that it needs a complex phase shifter.

The group-type unidirectional transducer at (b) needs a 90° phase shifter which specifically comprises a coil and also needs a meander line having a large total length, and causes a large filter insertion loss because of the ohmic loss of the long meander line.

The internal-reflection-type unidirectional transducer at (c) is a unidirectional interdigital transducer which requires no phase shifter with the exciting and reflecting positions shifted $\lambda_0/8$ from each other, and is expected to provide excellent characteristics.

One internal-reflection-type unidirectional transducer which has heretofore been proposed has a double electrode structure including positive and negative electrodes spaced by an electrode gap of $\lambda_0/8$ and divided into widths of $\lambda_0/8$. After positive double electrodes or negative double electrodes are fabricated, a thin metal film is added to one of the double electrodes to provide a mass loading effect. The double electrodes have a structure in which each electrode finger of an IDT are divided into two segments, and are also called split electrodes. The internal-reflection-type unidirectional transducer is problematic in that it has a poor conversion efficiency because of the double electrodes employed, and is difficult to use as a high-frequency device as it has IDT electrodes having a spacing of $\lambda_0/8$. Details of a mass-loading-effect unidirectional transducer are disclosed in, for example, C. S. Hartmann, et al., 1982 IEEE *Ultrasonic Symposium Proceedings*, pp. 40–45.

Another proposed internal-reflection-type unidirectional interdigital transducer having double electrodes is manufactured as follows: After one of double electrodes is formed on a substrate, a dielectric film having a uniform film thickness $H_0$ is applied thereto, and then the other one of double electrodes is applied to the dielectric film, providing different electromechanical coupling constants. This internal-reflection-type unidirectional interdigital transducer operates based on the difference between the magnitudes of the electromechanical coupling constants. However, the proposed internal-reflection-type unidirectional interdigital transducer are disadvantageous in that the fabrication process is complicated, the conversion efficiency is poor because double electrodes are employed, and the transducer is difficult to use as a high-frequency device as it has an IDT having a spacing of $\lambda_0/8$. An electromechanical-coupling-constant-changing-type unidirectional transducer is disclosed in, for example, K. Yamanouchi, et al., *Electronic Letters*, Vol. 20, No. 20, pp. 819–821, September 1982.

Apodized (weighted) transducers having IDT electrodes intersecting at varying intervals to achieve desired frequency characteristics have also been proposed in the art. However, the apodized transducers suffer problems in that electrodes for transmission and reception cannot be weighted and the apodized transducers have a weighing loss.

SUMMARY OF THE INVENTION

It is an object of the present invention to provide an Internal-reflection-type unidirectional surface acoustic wave transducer which can be manufactured by a simple process, does not require an external circuit, such as a phase shifter, to be added thereto, suffers a small loss, and has an excellent conversion efficiency.

Another object of the present invention is to provide a novel weighting method for an internal-reflection-type unidirectional surface acoustic wave transducer.

To achieve the above object, there is provided in accordance with the present invention a surface acoustic wave transducer comprising a substrate which is piezoelectric or electrostrictive, a first electrode disposed on a surface of the substrate and having a plurality of first electrode fingers, and a second electrode disposed on the surface of the substrate and having a plurality of second electrode fingers alternating with the first electrode fingers, and structural elements disposed on the surface of the substrate and arranged periodically in a propagating direction of surface acoustic waves. An IDT (interdigital transducer) structure is formed by alternatively disposing the first electrode fingers and the second electrode fingers.

Such an internal-reflection-type unidirectional surface acoustic wave transducer can be manufactured by forming thin grating strip films comprising dielectric films as structural elements on the surface of a piezoelectric substrate, and thereafter forming electrodes of an IDT of a normal structure at positions displaced from the thin grating strip films according to a mask alignment exposure process. Alternatively, it may be manufactured by forming an IDT of a normal structure on the surface of a piezoelectric substrate, and thereafter forming dielectric films of a thin grating strip film structure according to a mask alignment exposure process. Further alternatively, it may be manufactured by forming grating strip grooves as structural elements at periodic intervals of $\lambda_0/2$ or $\lambda_0$ on a substrate, and thereafter forming an IDT of a normal structure according to a mask alignment exposure process.

According to the present invention, It is possible to obtain an internal-reflection-type unidirectional surface acoustic wave transducer of excellent performance simply by using dielectric films, grooves, or thin films of a periodic structure according to a simple mask alignment process. The surface acoustic wave transducer requires no special phase shifter, and can inexpensively be manufactured at substantially the same cost as general ordinary bidirectional surface acoustic wave devices. As the surface acoustic wave transducer according to the present invention can employ electrode fingers each having a width of $\lambda_0/4$, it is possible to obtain a wide-band unidirectional transducer having a good conversion efficiency. If the surface acoustic wave transducer according to the present invention is used as input and output transducers, then since it has nothing responsible for causing special losses, it is possible to obtain inexpensively a filter having inherent characteristics of unidirectional transducers which suffers small ripples based on TTE (triple transit echoes), and which has a small insertion loss.

DETAILED DESCRIPTION OF THE INVENTION

Figure 1:
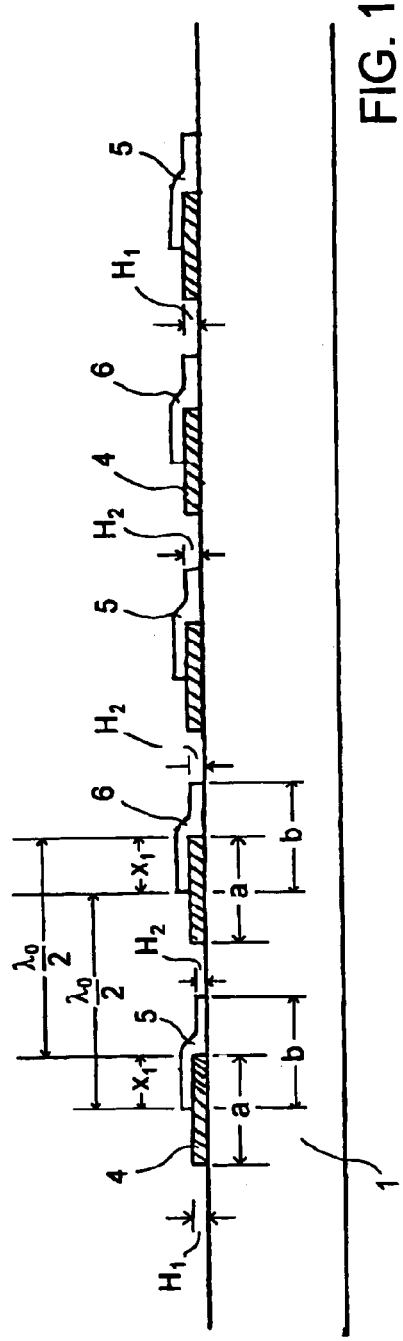
FIG. 1 is a cross-sectional view of an electromechanical-coupling-constant-changing-type unidirectional surface acoustic wave transducer according to a first embodiment of the present invention.
Figure 2:
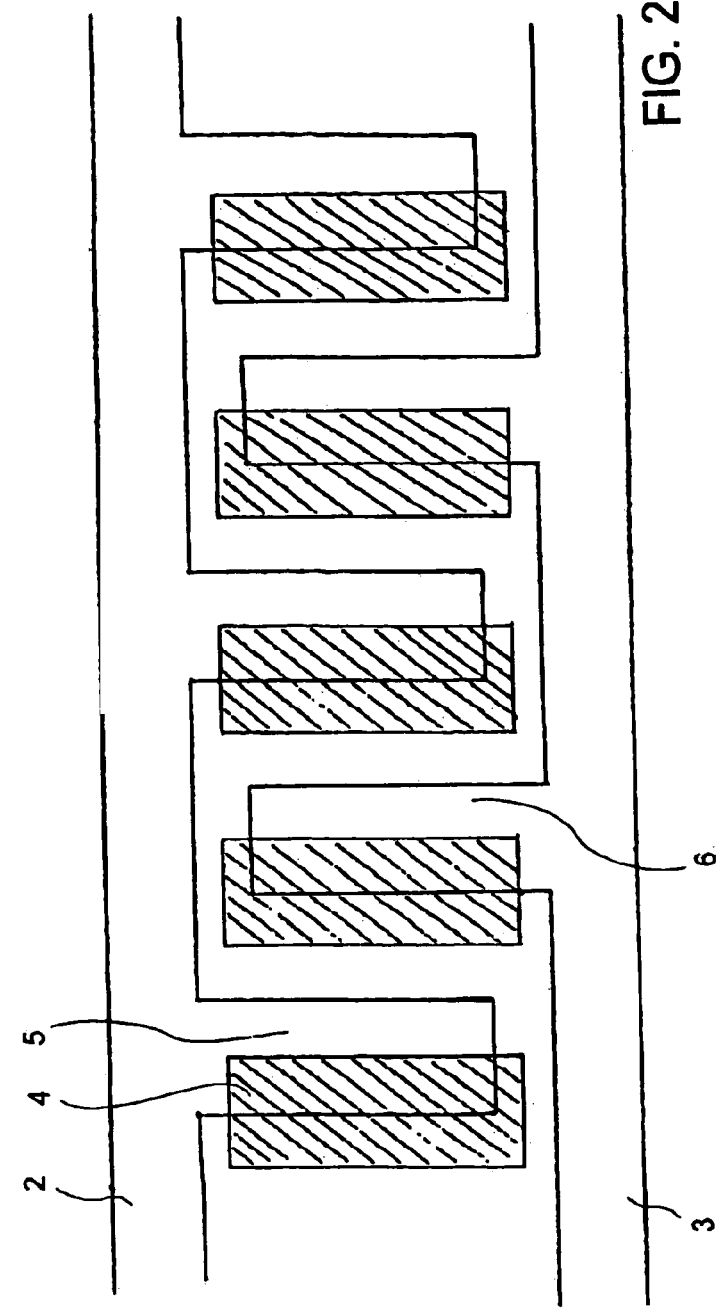
FIG. 2 is a plan view-of an electrode arrangement of the surface acoustic wave transducer shown in FIG. 1.

A surface acoustic wave transducer according to a first embodiment of the present Invention shown in FIGS. 1 and 2 is an electromechanical-coupling-constant-changing-type unidirectional surface acoustic wave transducer whose electromechanical coupling constant is changed in the propagating direction of surface acoustic waves to cause surface acoustic waves to propagate only in one direction. In the description which follows, the wavelength of surface acoustic waves at the fundamental operating frequency of the surface acoustic wave transducer is represented by $\lambda_0$, and the widths of electrode fingers, dielectric films, grooves, and a thin film refer to the lengths thereof along the propagating direction of surface acoustic waves.

The surface acoustic wave transducer according to the first embodiment comprises substrate 1 having a flat surface and positive and negative electrodes disposed on the flat surface of substrate 1, the positive and negative electrodes constituting an IDT (interdigital transducer). The positive and negative electrodes excite a surface acoustic wave and receive a propagated surface acoustic wave. The positive electrode comprises extracting electrode (i.e., bus bar) 2 extending along one side of substrate 1 and a plurality of electrode fingers 5 branched from extracting electrode 2. Similarly, the negative electrode comprises extracting electrode 3 extending along the other side of substrate 1 and a plurality of electrode fingers 6 branched from extracting electrode 3. Substrate 1 comprises a substrate made of a piezoelectric or electrostrictive material or a substrate having a thin piezoelectric film on its surface. The surface acoustic wave transducer also has a plurality of dielectric films 4 in the form of rectangular strips, each having a width "a" of $\lambda_0/4$, for example, disposed on the surface of substrate 1 in a repetitive pattern at periodic intervals of $\lambda_0/2$ along the propagating direction of surface acoustic waves. Each of dielectric films 4 extends in the direction in which positive and negative electrode fingers 5, 6 extend. Dielectric films 4 have a film thickness of $H_1$. Dielectric films 4 may be in the form of thin films of $SiO_2$, SiO, ZnO, $LiNbO_3$, $Ta_2O_5$, PZT (lead zirconate titanate), or glass.

In the surface acoustic wave transducer, electrode fingers 5 of the positive electrode and electrode fingers 6 of the negative electrodes are alternately disposed at periodic intervals of $\lambda_0/2$ thereby constituting an IDT structure. Electrode fingers 5 of the positive electrode are arranged at periodic intervals of $\lambda_0$, and electrode fingers 6 of the negative electrode arranged at periodic Intervals $\lambda_0$. As a result, those electrode fingers are arranged at periodic intervals $\lambda_0/2$ as electric fingers of the IDT structure. These electrode fingers have a film thickness of $H_2$ and a width "b" which is typically $\lambda_0/4$. Dielectric films 4 are associated with respective positive and negative electrode fingers 5, 6, which are disposed over both the exposed surface of substrate 1 and dielectric films 4 such that they have partial transverse areas positioned on dielectric films 4. The positions of central lines of respective dielectric films 4 and the positions of central lines of respective electrode fingers 5, 6 which are paired with those dielectric films are displaced from each other by a distance $x_1$ in the propagating direction of surface acoustic waves. The distance $x_1$ is typically equal to $\lambda_0/8$.

The surface acoustic wave transducer can be made by patterning dielectric films 4 on the surface of substrate 1, and then patterning electrode fingers 5, 6 on the assembly using a mask, at positions displaced from corresponding dielectric films 4 by the distance $x_1$. Dielectric films 4 may be replaced with metal films. In such a case, metal films of Al, Cu, Mo, Au, Ag, W, Ti or an alloy thereof can be used.

The surface acoustic wave transducer can be manufactured simply by forming an IDT of a normal structure according to a mask alignment exposure process on the surface of substrate 1 with dielectric films 4 or metal films disposed thereon. According to the present embodiment, therefore, the internal-reflection-type unidirectional surface acoustic wave transducer can be manufactured by a simple fabrication process. The surface acoustic wave transducer according to the present embodiment causes a low loss and is compatible with high frequencies because it does not need a phase shifter and has its electrode fingers whose width is not $\lambda_0/8$.

Figure 3:
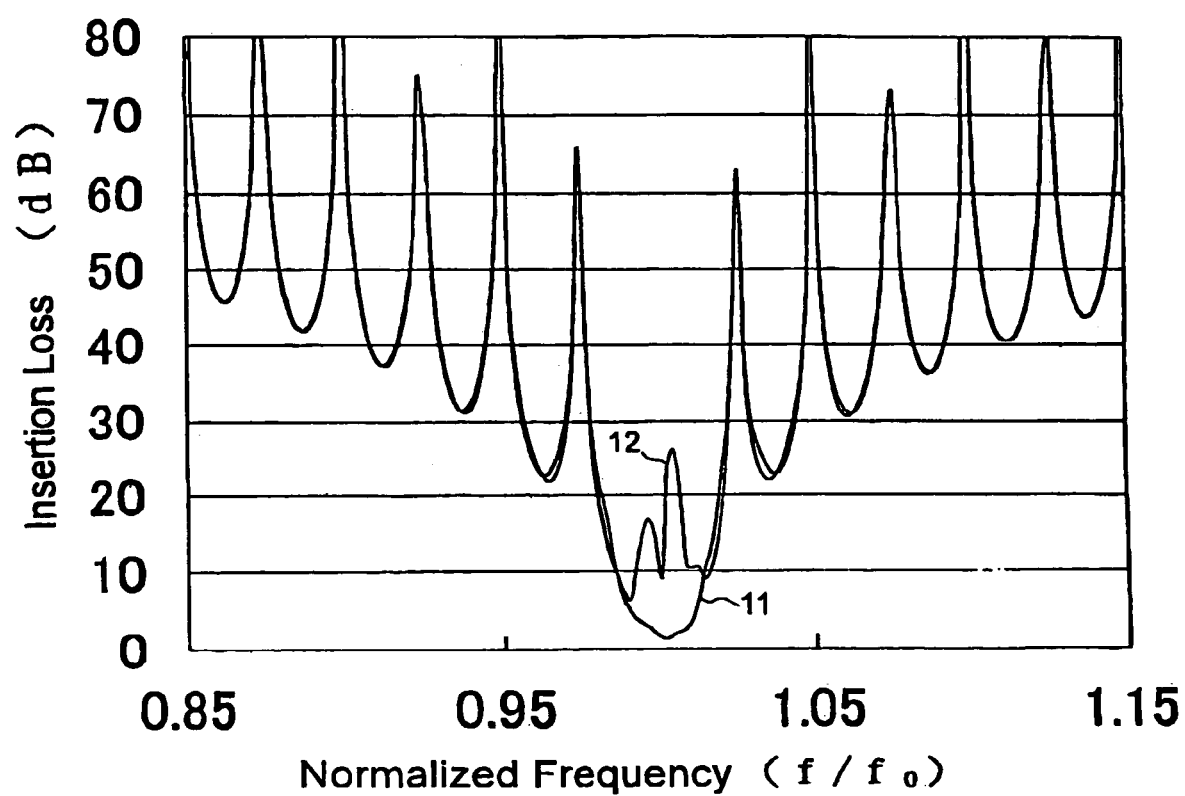
FIG. 3 is a graph showing, by way of example, an insertion loss of a filter which comprises the surface acoustic wave transducer shown in FIGS. 1 and 2 fabricated on a 128°-rotated Y-cut X-propagating LiNbO$_3$ substrate.

FIG. 3 shows an insertion loss determined by a simulation calculating process of a filter having two unidirectional surface acoustic wave transducers shown in FIGS. 1 and 2 which are disposed in confronting relation to each other on a 128°-rotated Y-cut X-propagating $LiNbO_3$ substrate when one of the unidirectional surface acoustic wave transducers excites a surface acoustic wave and the other unidirectional surface acoustic wave transducer receives the surface acoustic wave propagated thereto. When the two unidirectional surface acoustic wave transducers are oriented in one direction (i.e., in forward), a low insertion loss is achieved, i.e., a forward insertion loss of 0.7 dB is achieved, as indicated by the curve 11 in FIG. 3. When the two unidirectional surface acoustic wave transducers are oriented back to back (i.e., in backward), a large insertion loss of 25 dB is achieved as indicated by the curve 12 in FIG. 3.

The width "a" of dielectric films 4, the width "b" of positive and negative electrode fingers 5, 6, and the distance $x_1$ between the centers of dielectric films 4 and the centers of electrode fingers 5, 6 are not limited to the values described above. If the width "a" of dielectric films 4 is varied in the range from $0.05\lambda_0$ to $0.5\lambda_0$, the film thickness $H_1$ of dielectric films 4 is varied in the range from $0.001\lambda_0$ to $0.3\lambda_0$, the film thickness $H_2$ of positive and negative electrode fingers 5, 6 is varied in the range from $0.001\lambda_0$ to $0.3\lambda_0$, the width "b" of positive and negative electrode fingers 5, 6 is varied in the range from $0.05\lambda_0$ to $0.5\lambda_0$, and the distance $x_1$ between the centers of dielectric films 4 and the centers of electrode fingers 5, 6 is varied in the range from $-0.25\lambda_0$ to $0.25\lambda_0$, then it is possible to obtain surface acoustic wave transducers of the IDT type having various characteristics.

Each of electrode fingers 5, 6 may be of a double electrode structure, with one of them being positioned on dielectric films 4 and the other directly on the surface of substrate 1.

A surface acoustic wave transducer according to a second embodiment of the present invention will be described below with reference to FIGS. 4 and 5. The surface acoustic wave transducer according to the second embodiment is a mass-loading-changing-type unidirectional surface acoustic wave transducer which differs from the surface acoustic wave transducer according to the first embodiment in that the dielectric films and the electrode fingers on the substrate thereof are vertically inverted in position.

The surface acoustic wave transducer according to the second embodiment comprises substrate 1 having a flat surface and positive and negative electrodes as an IDT disposed on the flat surface of substrate 1. The positive and negative electrodes excite a surface acoustic wave and receive a propagated surface acoustic wave. The positive electrode comprises extracting electrode 2 extending along one side of substrate 1 and a plurality of electrode fingers 7 branched from extracting electrode 2. Similarly, the negative electrode comprises extracting electrode 3 extending along the other side of substrate 1 and a plurality of electrode fingers 9 branched from extracting electrode 3. In the surface acoustic wave transducer according to the second embodiment, electrode fingers 7, 9 have a film thickness of $H_3$ and are disposed directly on the surface of substrate 1. Electrode fingers 7, 9 are alternately disposed at periodic intervals of $\lambda_0/2$ as electrode fingers of the IDT structure and have a width "c" which is typically $\lambda_0/4$.

A plurality of dielectric films 8 in the form of rectangular strips, each having a width "d" typically of $\lambda_0/4$ and a film thickness of $H_4$, are disposed in a repetitive pattern at periodic intervals of $\lambda_0/4$ along the propagating direction of surface acoustic waves, such that dielectric films 8 are disposed over both electrode fingers 7, 9 and the exposed surface of substrate 1. Dielectric films 8 are associated with respective electrode fingers 7, 9. The positions of central lines of respective positive and negative electrode fingers 7, 9 and the positions central lines of dielectric films 8 that are paired with those electrode fingers are displaced from each other by a distance $x_2$ in the propagating direction of surface acoustic waves. The distance $x_2$ is typically equal to $\lambda_0/8$.

The surface acoustic wave transducer of the IDT type can be made by forming positive and negative electrodes of an IDT of a normal structure on the surface of substrate 1, and then forming dielectric films 8 on the assembly according to a mask alignment exposure process, at positions displaced from corresponding positive and negative electrode fingers 7, 9 by the distance $x_2$. According to the present embodiment, therefore, the unidirectional surface acoustic wave transducer causes a low loss, is compatible with high frequencies, and can be manufactured by a simple fabrication process. Dielectric films 8 may be replaced with metal films which may be identical to those described in the first embodiment. Dielectric films 8 may be identical to dielectric films 4 of the surface acoustic wave transducer according to the first embodiment.

In the present embodiment, if the width "c" of positive and negative electrode fingers 7, 9 is varied in the range from $0.05\lambda_0$ to $0.5\lambda_0$, the film thickness $H_3$ of positive and negative electrode fingers 7, 9 is varied in the range from $0.001\lambda_o$ to $0.3\lambda_0$, the width Mode of dielectric films 8 is varied in the range from $0.05\lambda_0$ to $0.5\lambda_0$, the film thickness $H_4$ of dielectric films 8 is varied in the range from $0.001\lambda_0$ to $0.3\lambda_0$, and the distance $X_2$ between the centers of dielectric films 8 and the centers of electrode fingers 7, 9 is varied in the range from $-0.25\lambda_0$ to $0.25\lambda_0$, then it is possible to obtain surface acoustic wave transducers having various characteristics.

Each of electrode fingers 7, 9 may be of a double electrode structure, with dielectric films 8 being disposed on one of them and no dielectric films on the other.

A surface acoustic wave transducer according to a third embodiment of the present invention will be described below with reference to FIGS. 6 and 7. As with the second embodiment, the surface acoustic wave transducer according to the third embodiment is a mass-loading-changing-type unidirectional surface acoustic wave transducer, but differs therefrom in that dielectric film 10 is disposed in covering relation to the entire surface of substrate 1 and electrode fingers 7, 9 formed on substrate 1. The thickness of dielectric film 10 is modulated to provide a mass loading changing effect.

A positive electrode having extracting electrode 2 and a plurality of electrode fingers 7, and a negative electrode having extracting electrode 3 and a plurality of electrode fingers 8 are disposed on a flat surface of substrate 1 having the flat surface. The positive and negative electrodes constitutes an IDT. Electrode fingers 7, 9 are alternately disposed in the propagating direction of surface acoustic waves at periodic intervals of $\lambda_0/2$, and have a width "e" which is typically $\lambda_0/4$.

Dielectric film 10 is disposed on the exposed surface of substrate 1 in covering relation to the entire surface of the positive and negative electrodes. Dielectric film 10 has, defined in its surface, grooves in the shape of rectangular strips extending in the direction in which electrode fingers 7, 9 extend and disposed at periodic intervals of $\lambda_0/4$ in the propagating direction of surface acoustic waves. The grooves have a depth $H_6$ and a width "f" which is typically $\lambda_0/4$. The position of central lines of the respective grooves and the position central lines of respective electrode fingers 7, 9 which are paired with those grooves are displaced from each other by a distance $x_3$ in the propagating direction of surface acoustic waves. The distance $x_3$ is typically equal to $\lambda_0/8$.

A process of manufacturing the surface acoustic wave transducer shown in FIGS. 6 and 7 will be described below. Positive and negative electrodes are formed on the surface of substrate 1, and dielectric film 10 is then formed on the surface of substrate 1 over the electrodes. At this time, dielectric film 10 has a flat upper surface, and a film thickness $H_5$ in areas free of electrode fingers. Thereafter, grooves are formed to the thickness $H_6$ in the surface of dielectric film 10 by etching.

Figure 8:
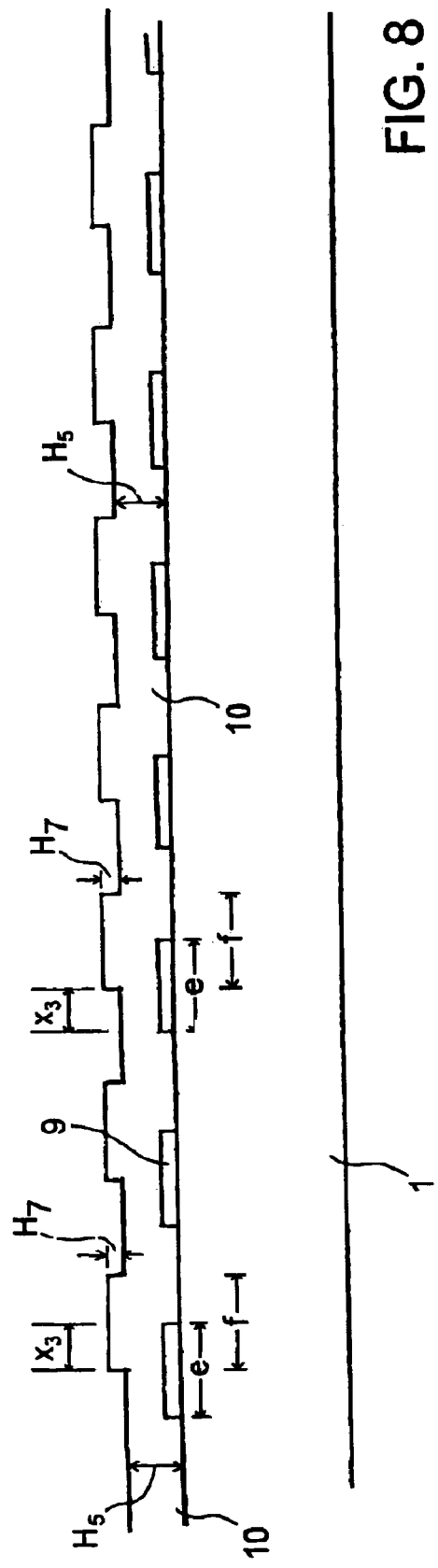
FIG. 8 is a cross-sectional view of a modification of the surface acoustic wave transducer according to the third embodiment of the present invention.

In the present embodiment, rather than forming grooves having the thickness $H_6$ in the surface of dielectric film 10, a dielectric film having a flat surface may be formed and then dielectric films in the form of rectangular strips, each having a width "f" and a thickness $H_7$, may be formed on the previously formed dielectric film. FIG. 8 shows such a modified surface acoustic wave transducer. In FIG. 8, the rectangular strips of dielectric film 10 are disposed in a repetitive pattern at periodic intervals of $\lambda_0/2$ along the propagating direction of surface acoustic waves. The dielectric film whose surface is flat has a thickness $H_5$ in areas free of electrode fingers.

Figure 6:
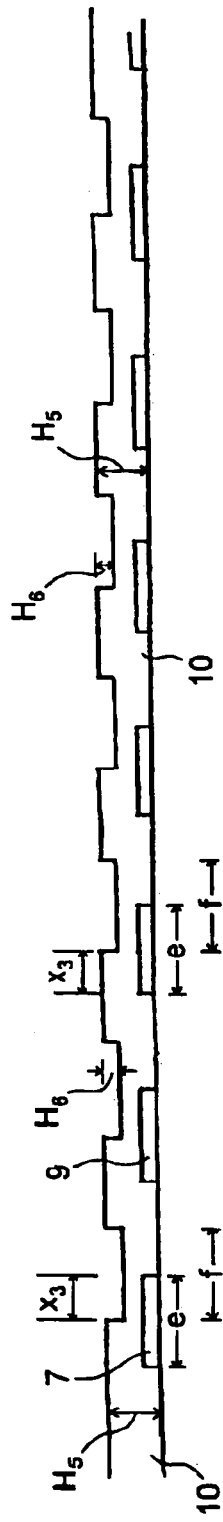
FIG. 6 is a cross-sectional view of a mass-loading-changing-type unidirectional surface acoustic wave transducer according to a third embodiment of the present invention.
Figure 7:
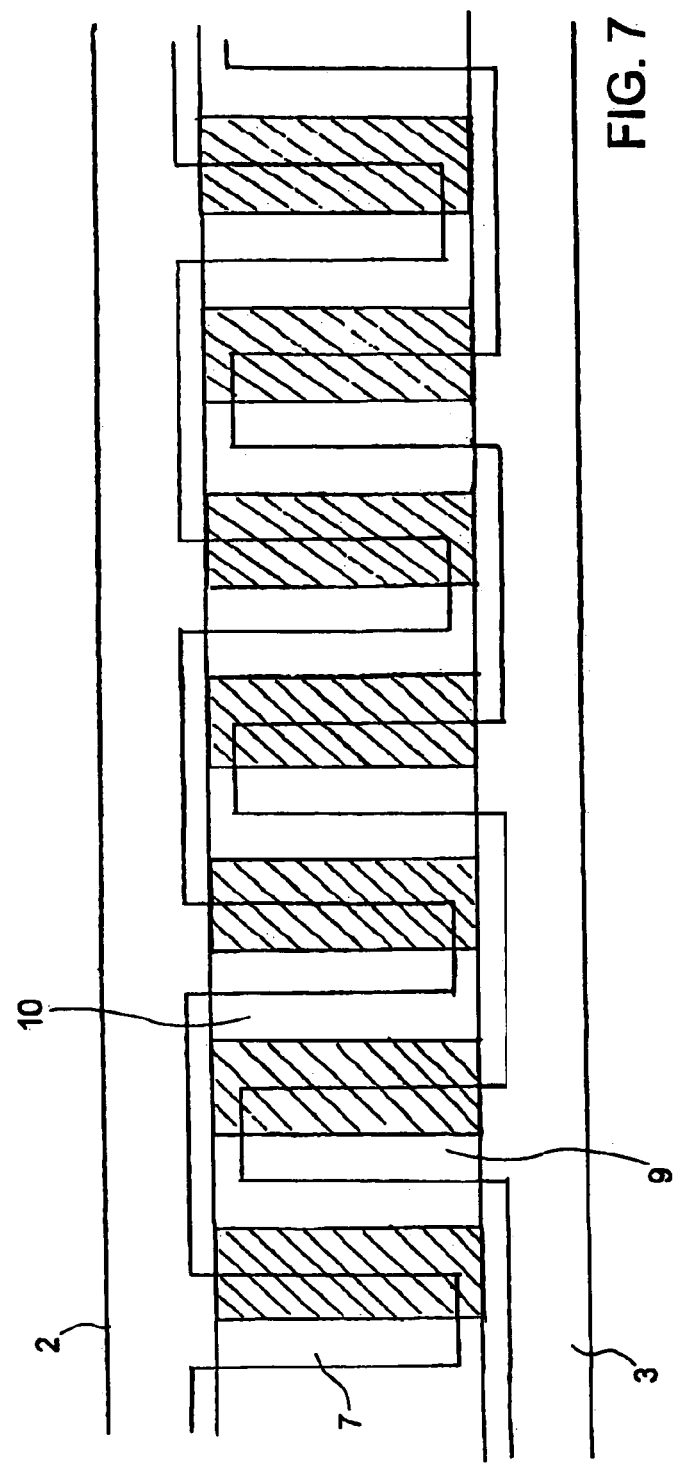
FIG. 7 is a plan view of an electrode arrangement of the surface acoustic wave transducer shown in FIG. 6.

The surface acoustic wave transducer shown in FIGS. 6 and 7 and the modified surface acoustic wave transducer shown in FIG. 8 can be manufactured using at least two masks by an exposure process that is carried out twice or more or an electron beam superposed exposure process. According to the present embodiment, it is possible to obtain a unidirectional surface acoustic wave transducer which causes a low loss, is compatible with high frequencies, and can be manufactured by a simple fabrication process. Dielectric film 10 may be identical to dielectric films 8 in the surface acoustic wave transducer according to the second embodiment.

In the present embodiment, if the width "e" of positive and negative electrode fingers 7, 9 is varied in the range from $0.05\lambda_0$ to $0.5\lambda_0$, the film thickness of positive and negative electrode fingers 7, 9 is varied in the range from $0.001\lambda_0$ to $0.3\lambda_0$, the width "f" of the grooves etched in dielectric film 10 or the width "f" of the rectangular strips of the dielectric film mounted on the flat dielectric film is varied in the range from $0.05\lambda_0$ to $0.5\lambda_0$, the depth $H_6$ of the grooves or the thickness $H_7$ of the rectangular strips is varied in the range from $0.001\lambda_0$ to $0.3\lambda_0$, and the distance $x_3$ between the centers of the grooves in dielectric film 10 or the rectangular strips and the centers of electrode fingers 7, 9 is varied in the range from $-0.25\lambda_0$ to $0.25\lambda_0$, then it is possible to obtain interdigital surface acoustic Wave transducers having various characteristics.

In the surface acoustic wave transducers according to the first to third embodiments, the periodic intervals of the electrode fingers and the dielectric films do not necessarily need to be exactly $\lambda_0/2$. The present invention is applicable to a dispersive surface acoustic wave transducer where the periodic intervals are progressively greater or smaller away from $\lambda_0/2$ according to a constant rule.

A surface acoustic wave transducer according to a fourth embodiment of the present invention will be described below with reference to FIGS. 9 and 10. The surface acoustic wave transducer according to the fourth embodiment is similar to the electromechanical-coupling-constant-changing-type unidirectional surface acoustic wave transducer according to the first embodiment, except that dielectric films 4 in the form of rectangular strips and electrode fingers 5, 6 overlap differently with respect to respective electrode fingers 5, 6, and electrode fingers 5, 6 are weighted accordingly. Specifically, whereas the electrode fingers are spaced at constant periodic intervals of $\lambda_0/2$, dielectric films 4 are spaced at periodic intervals that vary from position to position. The central positions of the electrode fingers and the central positions of the dielectric films are displaced substantially $\lambda_0/4$ in a central area of the surface acoustic wave transducer, but the electrode fingers and the dielectric films substantially fully overlap each other at opposite ends of the surface acoustic wave transducer. Since the electromechanical coupling constant is smaller as the overlapping area of the dielectric films and the electrode fingers is greater, the electrode fingers are weighted greatly in the central area of the surface acoustic wave transducer.

Figure 9:
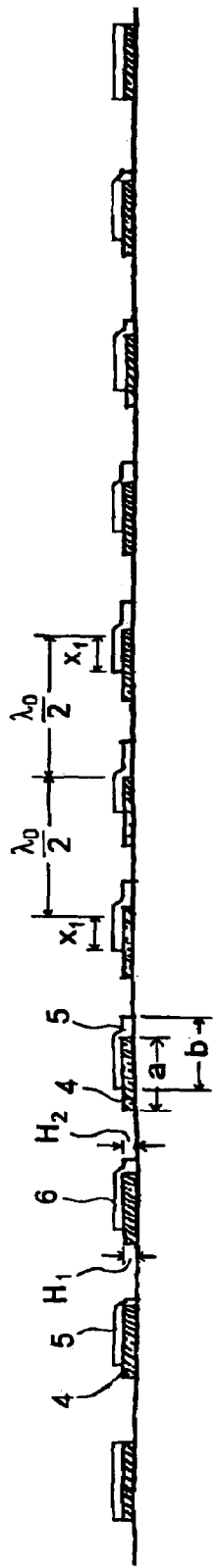
FIG. 9 is a cross-sectional view of a surface acoustic wave transducer according to a fourth embodiment of the present invention.
Figure 10:
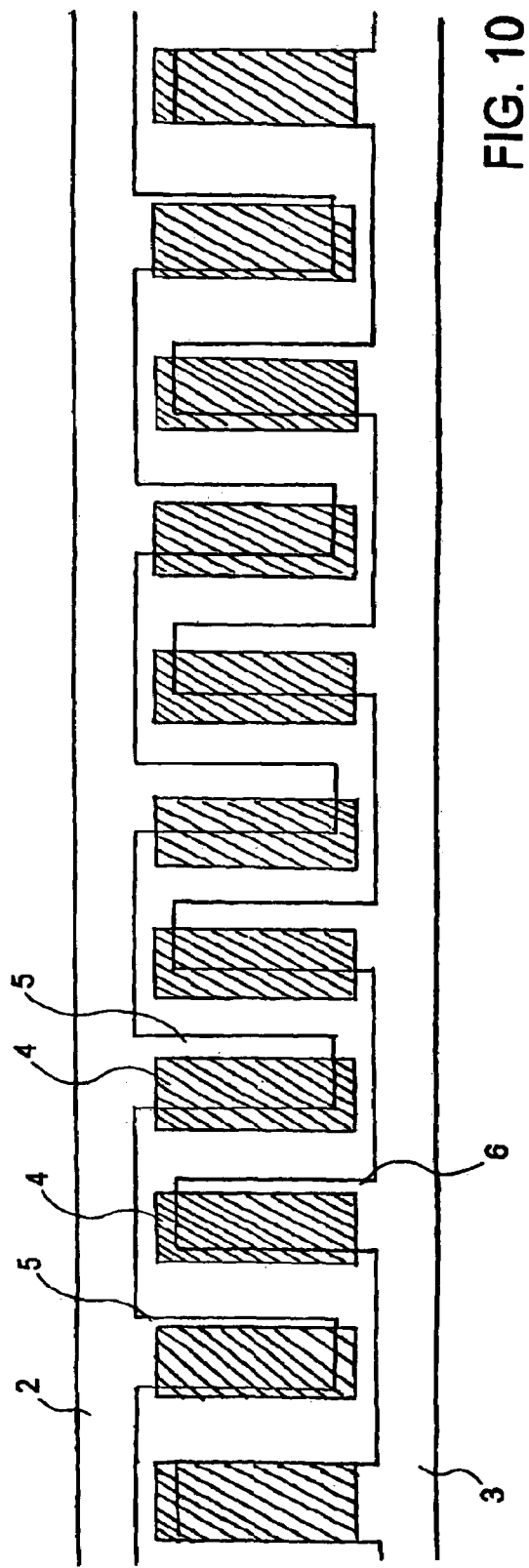
FIG. 10 is a plan view of an electrode arrangement of the surface acoustic wave transducer shown in FIG. 9.

Dielectric films 4 are shifted to the left in FIG. 9 from the corresponding electrode fingers except at the opposite ends of the surface acoustic wave transducer, the surface acoustic wave transducer is kept unidirectional.

The surface acoustic wave transducer can be manufactured by forming dielectric films 4 on substrate 1 and then forming positive and negative electrode fingers 5, 6 according to a mask alignment process using two masks or more or an electron beam double exposure process.

Figure 4:
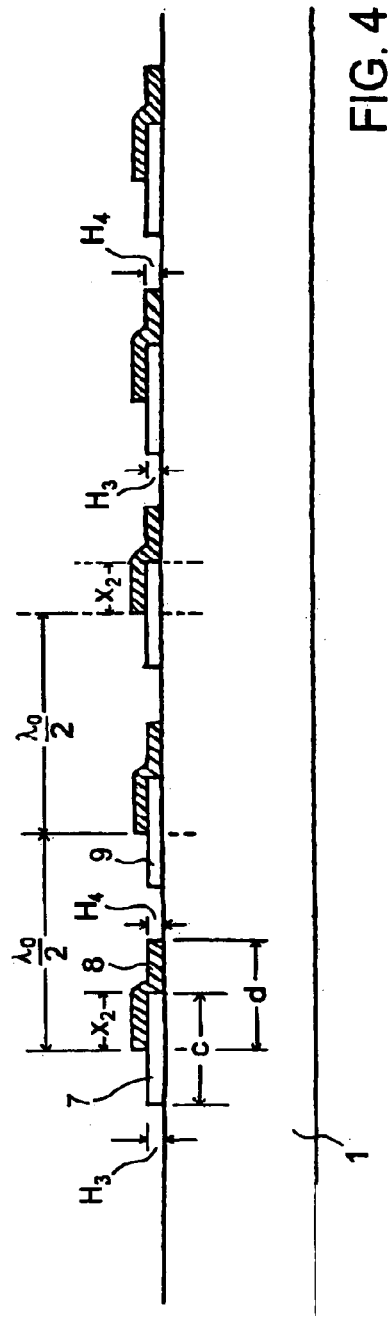
FIG. 4 is a cross-sectional view of a mass-loading-changing-type unidirectional surface acoustic wave transducer according to a second embodiment of the present invention.
Figure 5:
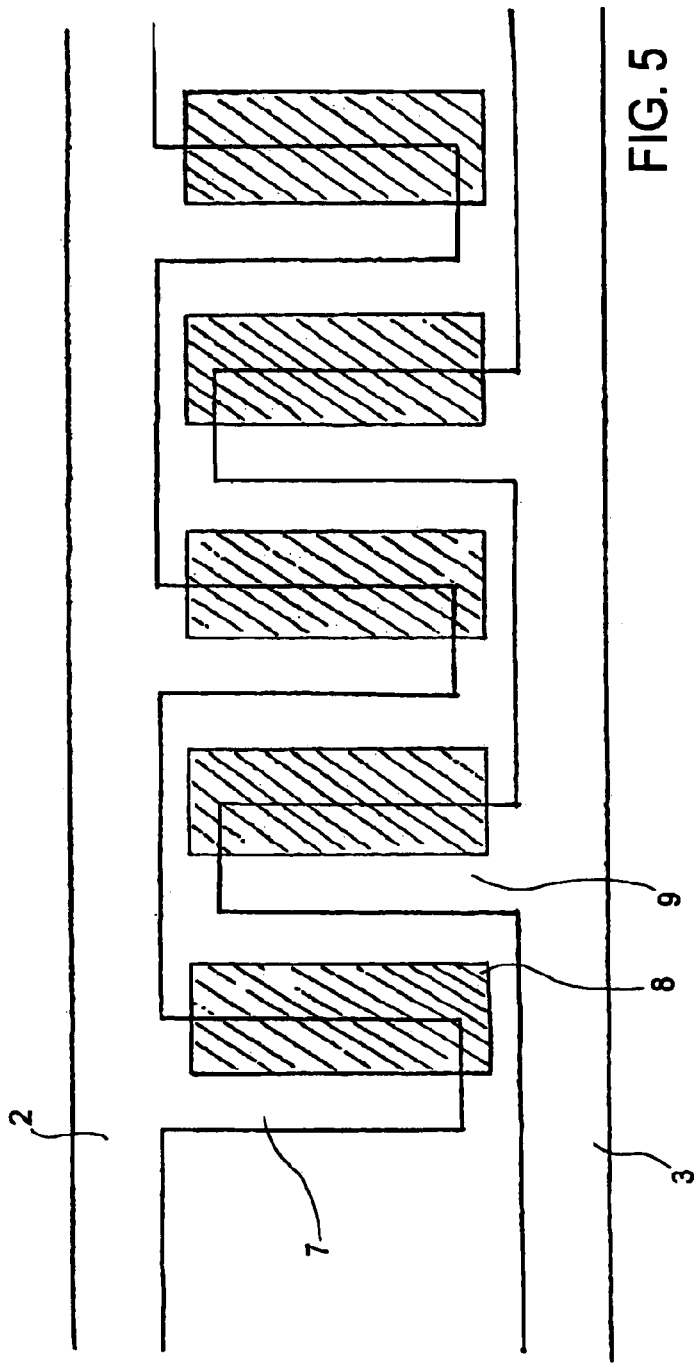
FIG. 5 is a plan view of an electrode arrangement of the surface acoustic wave transducer shown in FIG. 4.

The above weighting scheme is also applicable to the surface acoustic wave transducer according to the second embodiment shown in FIGS. 4 and 5. Specifically, the amount by which the electrode fingers and dielectric films 8 disposed thereon overlap each other may be varied.

According to the present embodiment, it is possible to keep the surface acoustic wave transducer unidirectional and also to vary the amount by which the electrode fingers and the dielectric films overlap each other for thereby weighting the electromechanical coupling constant. Accordingly, surface acoustic wave transducers and filters of excellent characteristics can be obtained. According to the present embodiment, in particular, because the electromechanical coupling constant can be weighted with the width of the electrode fingers being kept unchanged and with the periodic intervals of the electrode fingers being kept constant, it is possible to achieve filters of desired characteristics with a reduced weighting loss.

A surface acoustic wave transducer according to a fifth embodiment of the present invention will be described below with reference to FIGS. 11 and 12. In the first embodiment, the dielectric films in the form of rectangular strips are disposed at periodic intervals on the upper surface of the flat substrate. According to the present embodiment, however, rather than providing dielectric films, grooves 24 in the form of rectangular strips are defined at periodic intervals in the surface of substrate 21, providing an impedance-changing-type unidirectional surface acoustic wave transducer for propagating a surface acoustic wave only in one direction.

The surface acoustic wave transducer according to the fifth embodiment comprises substrate 21, a plurality of grooves 24 in the form of rectangular strips which are defined at periodic intervals in the surface of substrate 21, and positive and negative electrodes on the surface of substrate 21 including the positions of grooves 24, the positive and negative electrodes constituting an IDT. The positive and negative electrodes excite a surface acoustic wave and receive the propagated surface acoustic wave. The positive electrode comprises extracting electrode 22 extending along one side of substrate 21 and a plurality of electrode fingers 25 branched from extracting electrode 22. Similarly, the negative electrode comprises extracting electrode 23 extending along the other side of substrate 21 and a plurality of electrode fingers 26 branched from extracting electrode 23. Electrode fingers 25 of the positive electrode and electrode fingers 26 of the negative electrodes are alternately disposed at periodic intervals of $\lambda_0/2$ as electrode fingers of the IDT structure. Substrate 21 comprises a substrate made of a piezoelectric or electrostrictive material or a substrate having a thin piezoelectric film on its surface.

Grooves 24 defined in the surface of substrate 21 extend in the direction in which electrode fingers 25, 26 extend and are disposed at periodic intervals of $\lambda_0/2$ in the propagating direction of surface acoustic waves. Grooves 24 have a depth $H_{11}$ and a width "g" which is typically $\lambda_0/4$. Each of electrode fingers 25, 26 has a thickness $H_{22}$ and a width "h" which is typically $\lambda_0/4$. Therefore, grooves 24 are associated with the respective electrode fingers.

Each of electrode fingers 25, 26 lies across and over one longitudinal side of one of grooves 24, and has a transverse area positioned on the bottom of groove 24 and a remaining transverse area outside groove 24. The positions of central lines of respective grooves 24 and the positions of central lines of respective electrode fingers 25, 26 which are paired with those dielectric films are displaced from each other by a distance $x_4$ in the propagating direction of surface acoustic waves. The distance $x_4$ is typically equal to $\lambda_0/8$.

The surface acoustic wave transducer can be manufactured by preparing substrate 21 having a flat surface, forming grooves 24 in the surface of substrate 21 by etching or the like, and forming positive and negative electrodes according to a mask alignment exposure process on the surface of substrate 21 such that the central positions of grooves 24 and the central positions of the electrode fingers are displaced from each other by the distance $x_4$. The surface acoustic wave transducer propagates a surface acoustic wave in one direction based on the difference between the impedance in grooves 24 and the impedance on the surface of substrate 21. According to the present embodiment, the internal-reflection-type unidirectional surface acoustic wave transducer can be manufactured by a simple fabrication process. The surface acoustic wave transducer according to the present embodiment causes a low loss and is compatible with high frequencies because it does not need a phase shifter and has its electrode fingers whose width is not $\lambda_0/8$.

Figure 11:
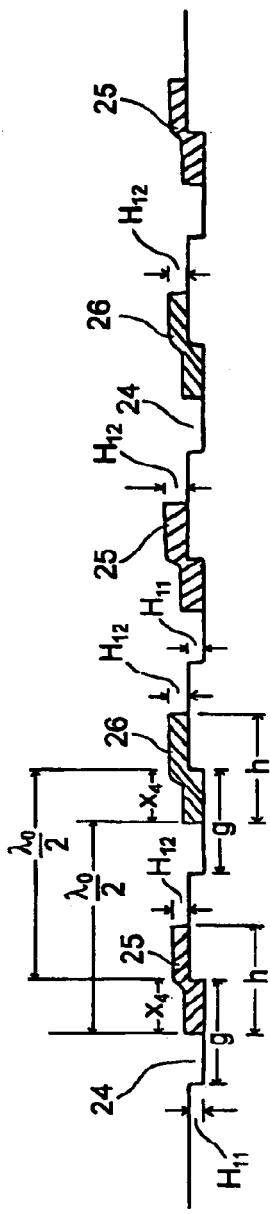
FIG. 11 is a cross-sectional view of an impedance-changing-type unidirectional surface acoustic wave transducer according to a fifth embodiment of the present invention.
Figure 12:
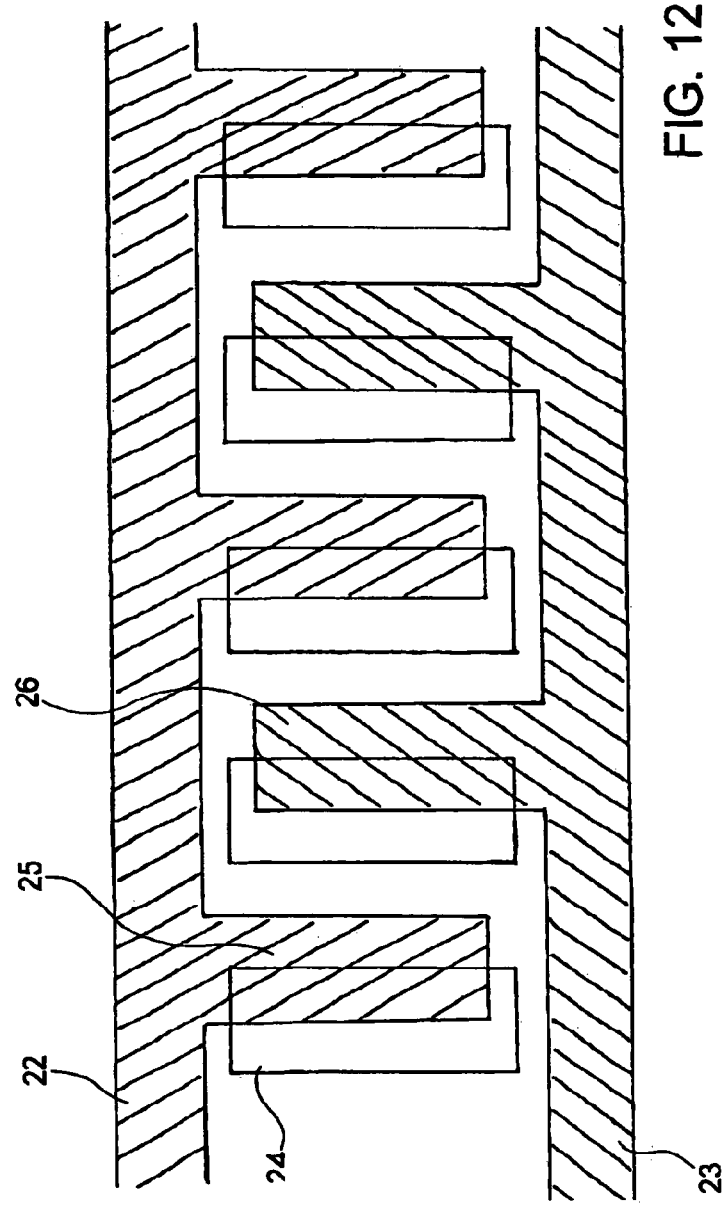
FIG. 12 is a plan view of an electrode arrangement of the surface acoustic wave transducer shown in FIG. 11.
Figure 13:
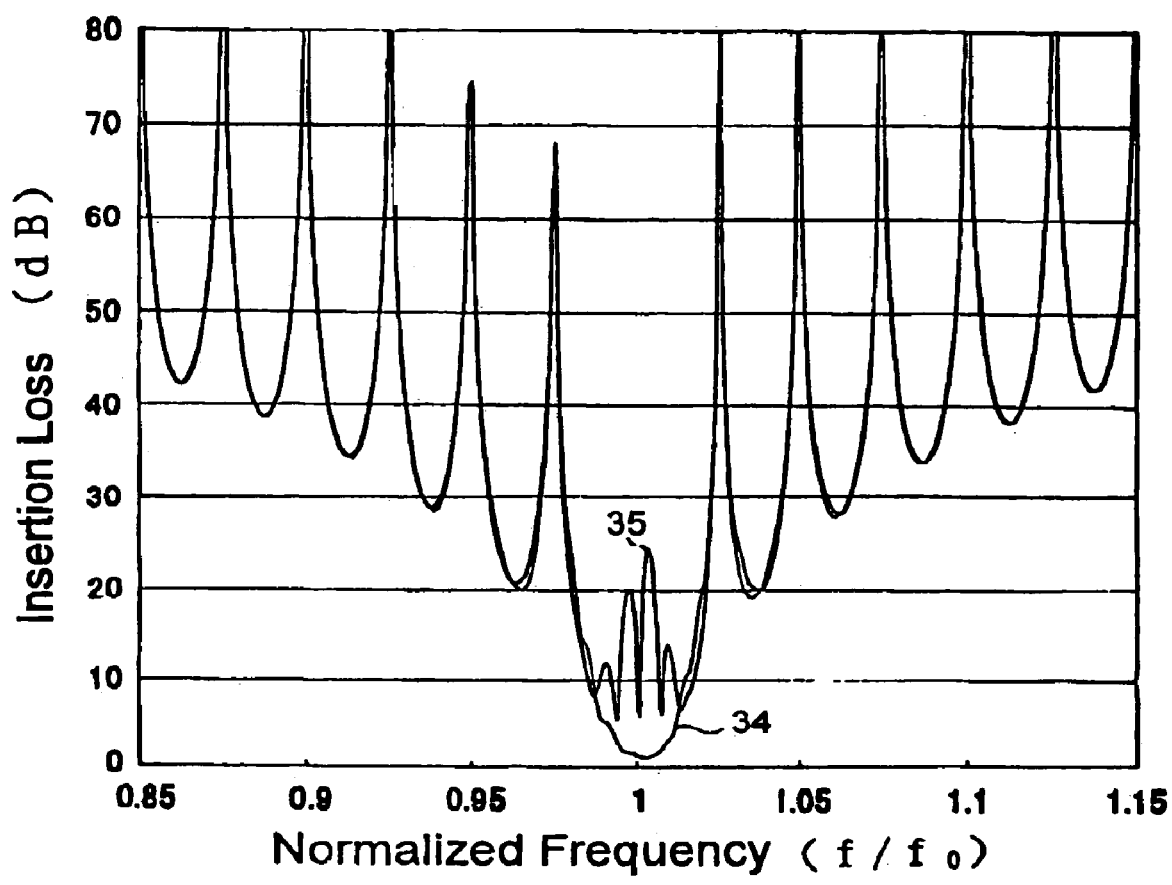
FIG. 13 is a graph showing, by way of example, an insertion loss of a filter which comprises the surface acoustic wave transducer shown in FIGS. 11 and 12 fabricated on a 128°-rotated Y-cut X-propagating LiNbO$_3$ substrate.

FIG. 13 shows an insertion loss determined by a simulation calculating process of a filter having two unidirectional surface acoustic wave transducers shown in FIGS. 11 and 12 which are disposed in confronting relation to each other on a 128°-rotated Y-cut X-propagating $LiNbO_3$ substrate. When the two unidirectional surface acoustic wave transducers are oriented in one direction (i.e., in forward), a low insertion loss is achieved, i.e., a forward insertion loss of 0.7 dB is achieved, as indicated by the curve 34 in FIG. 13. When the two unidirectional surface acoustic wave transducers are oriented back to back (i.e., in backward), a large insertion loss of 23 dB is achieved as indicated by the curve 35 in FIG. 13.

In the above surface acoustic wave transducer, if the width "g" of grooves 24 is varied in the range from $0.05\lambda_0$ to $0.5\lambda_0$, the depth $H_{11}$ of grooves 24 is varied in the range from $0.001\lambda_0$ to $0.3\lambda_0$, the film thickness $H_{12}$ of positive and negative electrode fingers 25, 26 is varied in the range from $0.001\lambda_0$ to $0.3\lambda_0$, the width "h" of positive and negative electrode fingers 25, 26 is varied in the range from $0.05\lambda_0$ to $0.5\lambda_0$, and the distance $x_4$ between the center positions of grooves 24 and the center positions of electrode fingers 25, 26 is varied in the range from $-0.25\lambda_0$ to $0.25\lambda_0$, then it is possible to obtain unidirectional interdigital surface acoustic wave transducers having various characteristics.

Each of electrode fingers 25, 26 may be of a double electrode structure, with one of them being positioned on the bottom of grooves 24 and the other directly on the surface of substrate 21.

A surface acoustic wave transducer according to a sixth embodiment of the present invention will be described below with reference to FIGS. 14 and 15. The surface acoustic wave transducer according to the sixth embodiment is similar to the surface acoustic wave transducer according to the fifth embodiment, except that the grooves are defined in the surface of substrate 21 at greater periodic intervals of $\lambda_0$. The surface acoustic wave transducer thus arranged according to the sixth embodiment serves as a susceptance-changing-type unidirectional surface acoustic wave transducer.

The surface acoustic wave transducer according to the sixth embodiment comprises substrate 21, positive and negative electrodes disposed on the surface of substrate 21, and a plurality of grooves 27 defined in the surface of substrate 21. The positive electrode comprises extracting electrode 22 extending along one side of substrate 21 and a plurality of electrode fingers 28 branched from extracting electrode 22. Similarly, the negative electrode comprises extracting electrode 23 extending along the other side of substrate 21 and a plurality of electrode fingers 29 branched from extracting electrode 23. Grooves 27 are disposed at periodic intervals of $\lambda_0$ in the propagating direction of surface acoustic waves. Grooves 27 have a depth $H_{23}$ and a width "j" which is typically $\lambda_0/2$. Electrode fingers 28, 29 have a thickness $H_{24}$ and are alternately disposed at periodic intervals of $\lambda_0/2$. Electrode fingers 28, 29 have a width "i" which is typically $\lambda_0/4$. Therefore, each of grooves 27 is associated with one positive electrode finger 28 and one negative electrode finger 29. The electrode fingers are positioned such that the central positions of one type of electrode fingers, i.e., positive electrode fingers 28 in the illustrated embodiment, and the central positions of grooves 27 associated therewith are displaced from each other by a distance $x_5$. The distance $x_5$ is typically $\lambda_0/8$. Positive electrode fingers 28 are disposed on the bottom of grooves 27 in contact with longitudinal sides of grooves 27, and negative electrode fingers 29 are disposed on the upper surface of substrate 21 in contact with the other longitudinal sides of grooves 27.

According to the present embodiment, the susceptance which appears at steps which are produced by forming grooves 27 is employed to realize an internal-reflection-type unidirectional surface acoustic wave transducer.

The surface acoustic wave transducer can be manufactured by forming groove 27 in substrate 21 and thereafter forming the positive and negative electrodes in desired positions by a mask alignment exposure process. Thus, there is obtained a unidirectional surface acoustic wave transducer which causes a low loss, is compatible with high frequencies, and can be manufactured by a simple fabrication process.

Figure 14:
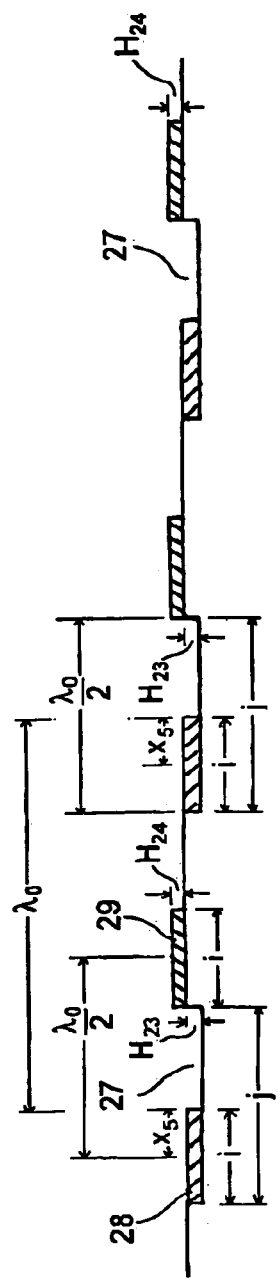
FIG. 14 is a cross-sectional view of a susceptance-changing-type unidirectional surface acoustic wave transducer according to a sixth embodiment of the present invention.
Figure 15:
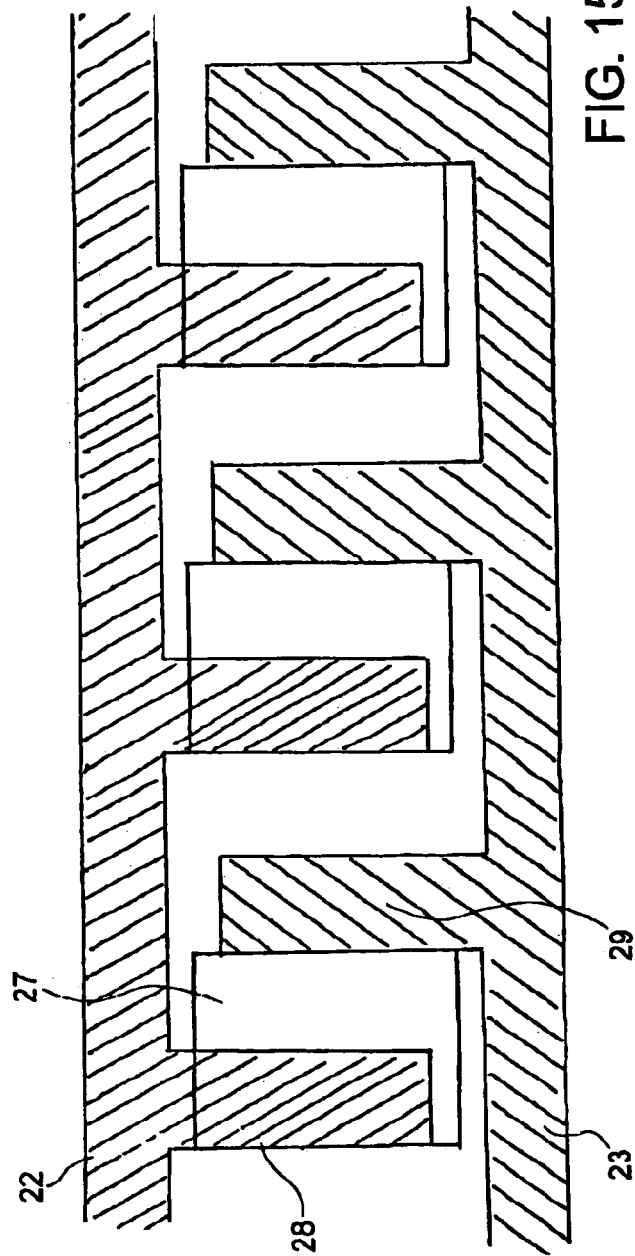
FIG. 15 is a plan view of an electrode arrangement of the surface acoustic wave transducer shown in FIG. 14.
Figure 16:
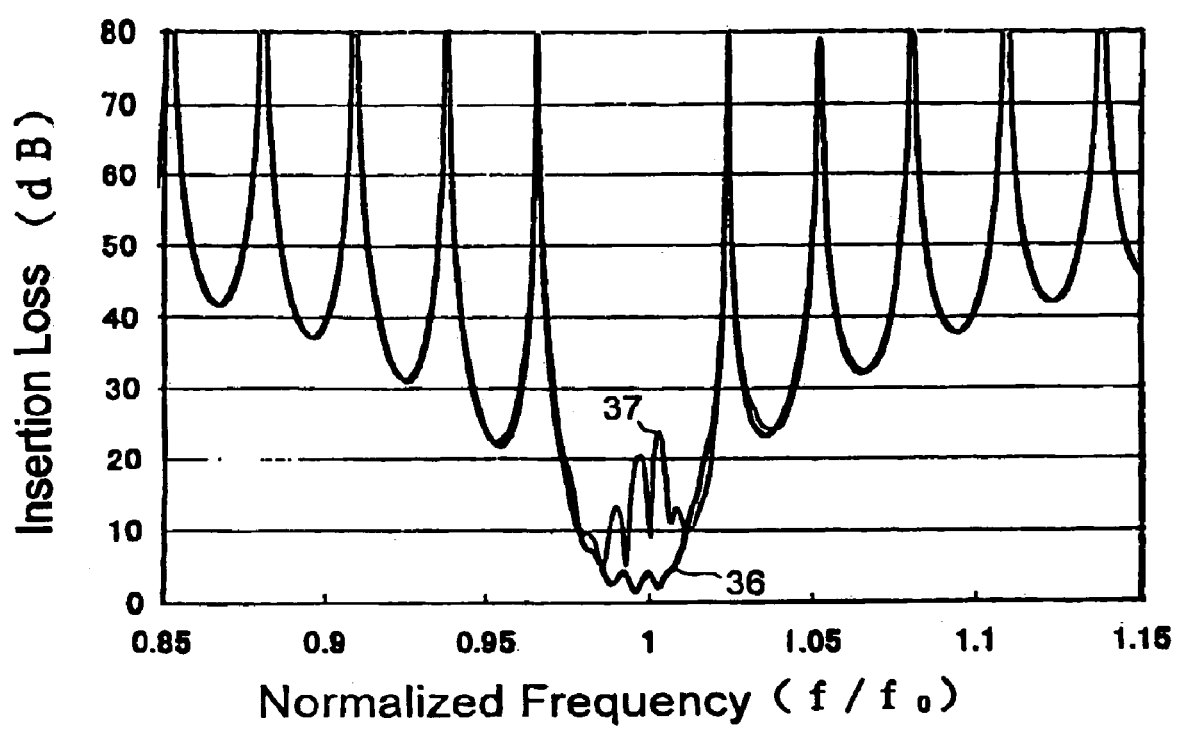
FIG. 16 is a graph showing, by way of example, an insertion loss of a filter that comprises the surface acoustic wave transducer shown in FIGS. 14 and 15 fabricated on a Y-cut Z-propagating LiNbO$_3$ substrate.

FIG. 16 shows an insertion loss determined by a simulation calculation of a filter having two unidirectional surface acoustic wave transducers shown in FIGS. 14 and 15 which are disposed in confronting relation to each other on a Y-cut Z-propagating LiNbO$_3$ substrate. When the two unidirectional surface acoustic wave transducers are oriented in one direction (i.e., in forward), a low insertion loss is achieved, i.e., a forward insertion loss of 1.0 dB is achieved, as indicated by the curve 36 in FIG. 16. When the two unidirectional surface acoustic wave transducers are oriented back to back (i.e., in backward), a large insertion loss of 22 dB is achieved as indicated by the curve 37 in FIG. 16.

According to the present embodiment, if the width "J", of grooves 27 is varied in the range from $0.25\lambda_0$ to $0.75\lambda_0$, the depth $H_{23}$ of grooves 27 is varied in the range from $0.001\lambda_0$ to $0.3\lambda_0$, the film thickness $H_{24}$ of positive and negative electrode fingers 28, 29 is varied in the range from $0.001\lambda_0$ to $0.3\lambda_0$, the width "i" of positive and negative electrode fingers 28, 29 is varied in the range from $0.05\lambda_0$ to $0.5\lambda_0$, and the distance $x_5$ is varied in the range from $-0.25\lambda_0$ to $0.25\lambda_0$, then it is possible to obtain unidirectional interdigital surface acoustic wave transducers having various characteristics.

Electrode fingers 28, 29 may be formed after a dielectric film of SiO$_2$ or the like is applied to grooves 27.

Figure 17:
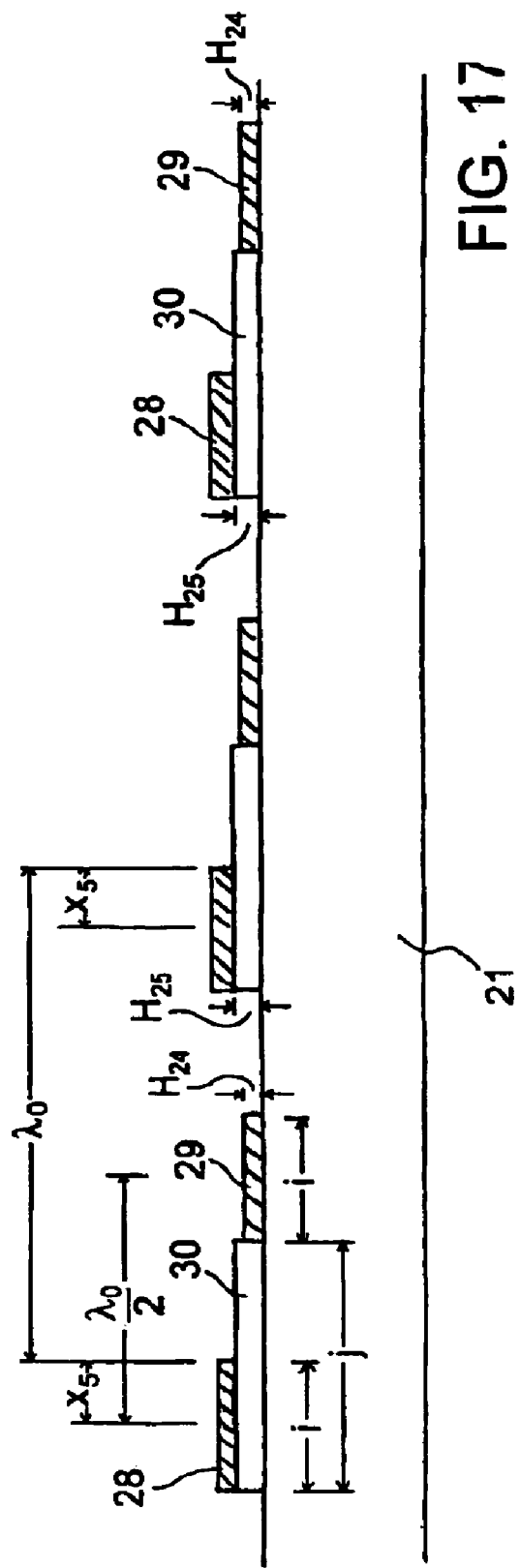
FIG. 17 is a cross-sectional view of a susceptance-changing-type unidirectional surface acoustic wave transducer according to a seventh embodiment of the present invention.

A surface acoustic wave transducer according to a seventh embodiment of the present Invention will be described below with reference to FIG. 17. In the surface acoustic wave transducer according to the sixth embodiment, grooves 27 are defined in the surface of substrate 21. According to the seventh embodiment, however, thin films spaced at periodic intervals of $\lambda_0$ and having a width "j" and a film thickness $H_{25}$ are disposed on the surface of the substrate. FIG. 17 shows a susceptance-changing-type unidirectional surface acoustic wave transducer having such thin films 30 according to the seventh embodiment. The width "j" is typically $\lambda_0/2$ as with the sixth embodiment in the illustrated embodiment, positive electrode fingers 28 are disposed on the upper surface of thin films 30 in contact with longitudinal sides of thin films 30, and negative electrode fingers 29 are disposed on the upper surface of substrate 21 in contact with the other longitudinal sides of thin films 30. Thin films 30 may comprise dielectric films of fused quartz, glass, Al$_2$O$_3$, or the like.

According to the present embodiment, the susceptance which appears at steps which are produced by forming thin films 30 is employed to realize an internal-reflection-type unidirectional surface acoustic wave transducer.

According to the present embodiment, if the width "j" of thin films 30 is varied in the range from $0.25\lambda_0$ to $0.75\lambda_0$, the film thickness $H_{25}$ of thin films 30 is varied in the range from $0.001\lambda_0$ to $0.3\lambda_0$, the film thickness $H_{24}$ of positive and negative electrode fingers 28, 29 is varied in the range from $0.001\lambda_0$ to $0.3\lambda_0$, the width "i" of positive and negative electrode fingers 28, 29 is varied in the range from $0.05\lambda_0$ to $0.5\lambda_0$, and the distance $x_5$ is varied in the range from $-0.25\lambda_0$ to $0.25\lambda_0$, then it is possible to obtain unidirectional interdigital surface acoustic wave transducers having various characteristics.

Figure 18:
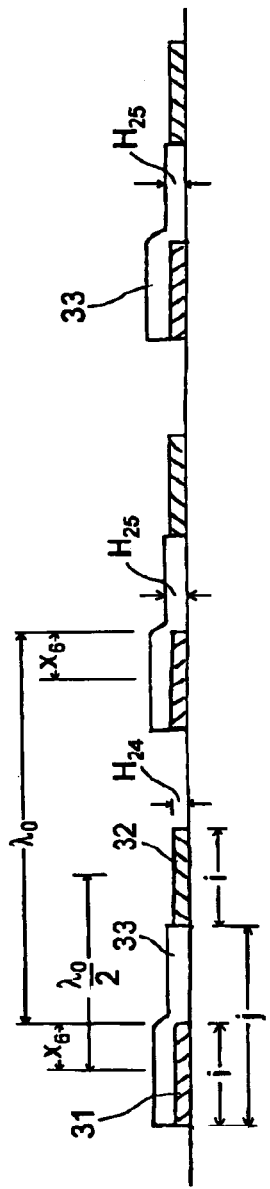
FIG. 18 is a cross-sectional view of a susceptance-changing-type unidirectional surface acoustic wave transducer according to an eighth embodiment of the present invention.
Figure 19:
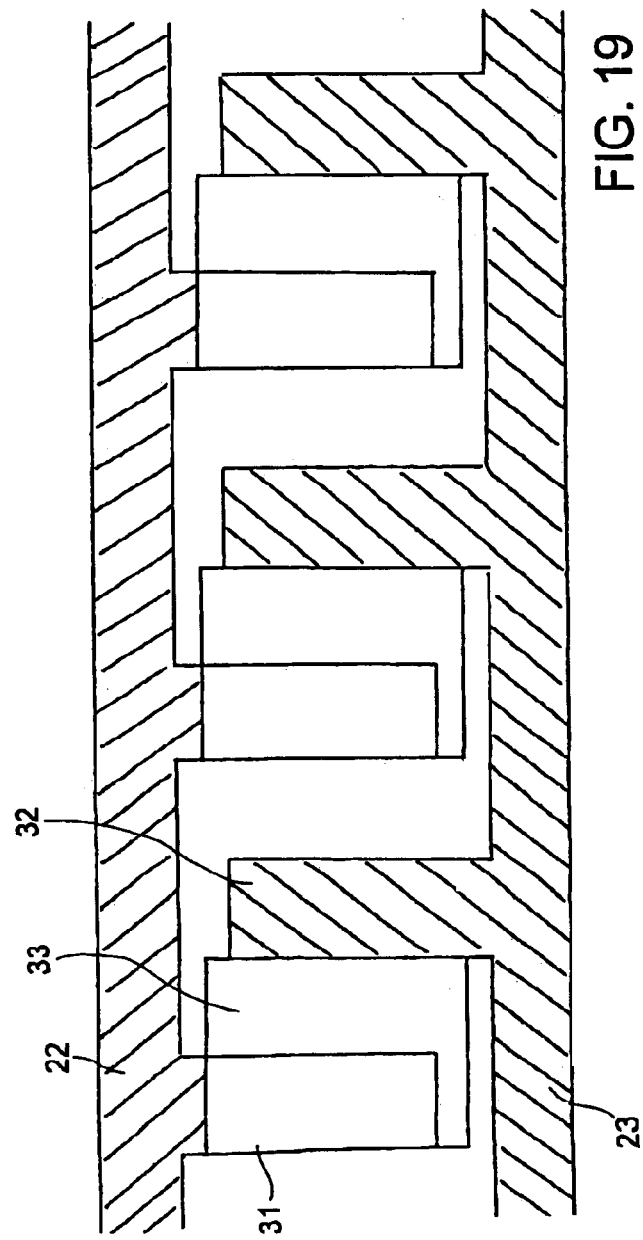
FIG. 19 is a plan view of an electrode arrangement of the surface acoustic wave transducer shown in FIG. 18.

A surface acoustic wave transducer according to an eighth embodiment of the present invention will be described below with reference to FIGS. 18 and 19. The surface acoustic wave transducer according to the eighth embodiment is constructed as a susceptance-changing-type unidirectional surface acoustic wave transducer which is provided by inverting the vertical relationship between the thin films and the electrode fingers on the substrate of the surface acoustic wave transducer according to the seventh embodiment.

The surface acoustic wave transducer according to the eighth embodiment comprises substrate 21 having a flat surface and positive and negative electrodes disposed on the surface of substrate 21. The positive electrode comprises extracting electrode 22 extending along one side of substrate 21 and a plurality of electrode fingers 31 branched from extracting electrode 22. Similarly, the negative electrode comprises extracting electrode 23 extending along the other side of substrate 21 and a plurality of electrode fingers 32 branched from extracting electrode 23. Electrode fingers 31, 32 have a film thickness $H_{24}$ and are directly disposed on the surface of substrate 21. Positive and negative electrode fingers 31, 32 are alternately disposed at periodic intervals of $\lambda_0/2$ as electrode fingers and have a width "i" which is typically $\lambda_0/4$.

Thin films 33 having a width "j" which is typically $\lambda_0/2$ and a film thickness $H_{25}$ are disposed at periodic intervals $\lambda_0$ in the propagating direction of surface acoustic waves so as to cover substrate 21 and electrode fingers 31, 32 in a regular pattern. Thin films 33 may be identical to thin films 30 according to the seventh embodiment. In the present embodiment, the susceptance which appears at steps which are produced by forming thin films 33 is employed to realize an internal-reflection-type unidirectional surface acoustic wave transducer.

The above surface acoustic wave transducer can be manufactured by forming positive and negative electrodes of a normal structure on the surface of substrate 21 and applying thin films 33 thereto according to a mask alignment exposure process. Thus, there is obtained a unidirectional surface acoustic wave transducer which causes a low loss, is compatible with high frequencies, and can be manufactured by a simple fabrication process. Thin films 33 may be made of the same material as the material of the thin films of the surface acoustic wave transducer according to the seventh embodiment.

According to the present embodiment, H the width "j" of thin films 33 is varied in the range from $0.25\lambda_0$ to $0.75\lambda_0$, the film thickness $H_{25}$ of thin films 33 is varied in the range from $0.001\lambda_0$ to $0.3\lambda_0$, the film thickness $H_{24}$ of positive and negative electrode fingers 31, 32 is varied in the range from $0.001\lambda_0$ to $0.3\lambda_0$, the width "i" of positive and negative electrode fingers 31, 32 is varied in the range from $0.05\lambda_0$ to $0.5\lambda_0$, and the distance $x_6$ is varied in the range from $-0.25\lambda_0$ to $0.25\lambda_0$, then it is possible to obtain unidirectional interdigital surface acoustic wave transducers having various characteristics.

In the surface acoustic wave transducers according to the fifth to eighth embodiments, the periodic intervals of the electrode fingers, the periodic intervals of the grooves, and the periodic intervals of the thin films do not necessarily need to be exactly $\lambda_0/2$ or $\lambda_0$. These periodic intervals may be varied from those values. For example, the present invention is applicable to a dispersive surface acoustic wave transducer where the periodic intervals are varied according to a constant rule.

In the various surface acoustic wave transducers according to the present invention, the electrodes in the IDT structure, particularly their electrode fingers, are made of a metal such as Al, Cu, Mo, Au, Ag, W, Ti or an alloy thereof. Each of the IDT electrodes may be of a double electrode structure. If the substrate of the surface acoustic wave transducers is made of a piezoelectric or electrostrictive material, the substrate may preferably be made of quartz crystal, single crystal of langasites, single crystal of $Li_2B_4O_7$, single crystal of $Bi_{12}GeO_{20}$, single crystal of $Bi_{12}SiO_{20}$, single crystal of $LiNbO_3$, single crystal of $LiTaO_3$, single crystal of $KNbO_3$, or PZT. If the substrate has a thin piezoelectric film, then the thin piezoelectric film may preferably be made of ZnO, AlN, $LiTaO_3$, $LiNbO_3$, $KNbO_3$, $Ta_2O_5$, or PZT.

According to the present invention, a dielectric film made of a thin film of $SiO_2$ having a film thickness in the range from $0.05\lambda_0$ to $0.5\lambda_0$ or a dielectric film made of glass having positive frequency-temperature characteristics may be applied to the surface of the surface acoustic wave transducer according to each of the above embodiments.

The internal-reflection-type unidirectional surface acoustic wave transducer according to the present invention includes an internal-reflection-type unidirectional surface acoustic wave transducer which operates at a frequency $N\omega_0$ where N represents an integer of 1 or more and $\omega_0$ a fundamental operating angular frequency at a wavelength $\lambda_0$.

If unidirectional surface acoustic wave transducers according to the present invention are disposed in facing relation (i.e., "forward") to each other and have IDT electrodes arranged in phase with each other, then a surface acoustic wave resonator having good characteristics is obtained. If reflectors are provided on propagation paths on both sides of the surface acoustic wave transducers of the surface acoustic wave resonator, then a surface acoustic wave resonator having better characteristics with a large reflection coefficient is obtained. These resonators should be interpreted as failing within the scope of attached claims.

What is claimed is:

1. A surface acoustic wave transducer comprising:
   a substrate which is piezoelectric or electrostrictive;
   a first electrode disposed on a surface of said substrate and having a plurality of first electrode fingers;
   a second electrode disposed on the surface of said substrate and having a plurality of second electrode fingers alternating with said first electrode fingers; and
   structural elements disposed on the surface of said substrate and arranged periodically in a propagating direction of surface acoustic waves;
   wherein $\lambda_0$ represents a wavelength which corresponds to a fundamental operating frequency of said surface acoustic wave transducer;
   wherein said structural elements are dielectric films disposed on the surface of said substrate and arranged at periodic intervals of $\lambda_0/2$ in the propagating direction of surface acoustic waves;
   wherein said first and second electrode fingers are arranged at periodic intervals of $\lambda_0/2$ as electrode fingers and have at least portions thereof which overlap said dielectric films; and
   wherein said substrate, said dielectric films, and said electrode fingers are stacked in this order in regions where said electrode fingers and said dielectric films overlap each other.

2. A surface acoustic wave transducer comprising:
   a substrate which is piezoelectric or electrostrictive;
   a first electrode disposed on a surface of said substrate and having a plurality of first electrode fingers;
   a second electrode disposed on the surface of said substrate and having a plurality of second electrode fingers alternating with said first electrode fingers; and
   structural elements disposed on the surface of said substrate and arranged periodically in a propagating direction of surface acoustic waves;
   wherein said first and second electrode fingers are arranged as electrode fingers at periodic intervals of $\lambda_0/2$ and said structural elements are film members arranged at periodic intervals of $\lambda_0$ where $\lambda_0$ represents a wavelength corresponding to a fundamental operating freguency of the surface acoustic wave transducer.

3. The surface acoustic wave transducer according to claim 1, wherein each of said dielectric films has a width of $\lambda_0/4$, each of said electrode fingers has a width of $\lambda_0/4$, and respective central positions of said dielectric films and respective central positions of said electrode fingers associated respectively with said dielectric films are spaced from each other by a distance of $\lambda_0/8$ in the propagating direction of surface acoustic waves.

4. The surface acoustic wave transducer according to claim 1, wherein each of said dielectric films has a width in a range from $0.05\lambda_0$ to $0.5 \lambda_0$, each of said dielectric films has a film thickness in a range from $0.001\lambda_0$ to $0.3\lambda_0$, each of said electrode fingers has a width in a range from $0.05\lambda_0$ to $0.5\lambda_0$, each of said electrode fingers has a film thickness in a range from $0.001\lambda_0$ to $0.3\lambda_0$, and respective central positions of said dielectric films and respective central positions of said electrode fingers associated respectively with said dielectric films are spaced from each other by a distance in a range from $-0.25\lambda_0$ to $0.25\lambda_0$ in the propagating direction of surface acoustic waves.

5. A surface acoustic wave transducer $\lambda_0$ representing a wavelength which corresponds to a fundamental operating frequency of said surface acoustic wave transducer, comprising:
   a substrate which is piezoelectric or electrostrictive;
   a first electrode disposed on a surface of said substrate and having a plurality of first electrode fingers;
   a second electrode disposed on the surface of said substrate and having a plurality of second electrode fingers alternating with said first electrode fingers;
   structural elements disposed an the surface of said substrate and arranged periodically in a propagating direction of surface acoustic waves; and
   a dielectric film disposed on the surface of said substrate in covering relation to said first comb electrode and said second electrode,
   wherein said structural elements are disposed as grooves or lands on a surface of said dielectric film and arranged at periodic intervals $\lambda_0/2$ in the propagating direction of surface acoustic waves, and said first and second electrode fingers are arranged at periodic intervals of $\lambda_0/2$ and have at least portions thereof overlapping said structural elements.

6. The surface acoustic wave transducer according to claim 5, wherein each of said structural elements has a width of $\lambda_0/4$, each of said electrode fingers has a width of $\lambda_0/4$, and respective central positions of said structural elements and respective central positions of said electrode fingers associated respectively with said structural elements are spaced from each other by a distance of $\lambda_0/8$ in the propagating direction of surface acoustic waves.

7. The surface acoustic wave transducer according to claim 5, wherein each of said structural elements has a width in a range from $0.05\lambda_0$ to $0.5\lambda_0$, each of said structural elements has a height in a range from $0.001\lambda_0$ in $0.3\lambda_0$, each of said electrode fingers has a width in a range from $0.05\lambda_0$ to $0.5\lambda_0$, each of said electrode fingers has a turn thickness in a range from $0.001\lambda_0$ to $0.3\lambda_0$ and respective central positions of said dielectric films and respective central positions of said electrode fingers associated respectively with said dielectric films are spaced from each other by a distance in a range from $-0.25\lambda_0$ to $0.25\lambda_0$ in the propagating direction of surface acoustic waves.

8. The surface acoustic wave transducer according to claim 1, wherein each of said first and second electrodes has a double electrode structure.

9. The surface acoustic wave transducer according to claim 1, further comprising a thin film of $SiO_2$, disposed on an outermost surface of the surface acoustic wave transducer and having a thickness in a range from $0.005\lambda_0$ to $0.5\lambda_0$, or a thin film of glass disposed on an outermost surface of the surface acoustic wave transducer and having positive frequency-temperature characteristics.

10. The surface acoustic wave transducer according to claim 5, further comprising a thin film of $SiO_2$ disposed on an outermost surface of the surface acoustic wave transducer and having a thickness in a range from $0.005\lambda_0$ to $0.5\lambda_0$, or a thin film of glass disposed on an outermost surface of the surface acoustic wave transducer and having positive frequency-temperature characteristics.

11. The surface acoustic wave transducer according to claim 1, wherein said electrode fingers are weighted by changing areas of regions where said electrode fingers and said dielectric films overlap each other.

12. A surface acoustic wave transducer $\lambda_0$, representing a wavelength which corresponds to a fundamental operating frequency of said surface acoustic wave transducer, comprising:
   a substrate which is piezoelectric or electrostrictive;
   a first electrode disposed on a surface of said substrate and having a plurality of first electrode fingers;
   a second electrode disposed on the surface of said substrate and having a plurality of second electrode fingers alternating with said first electrode fingers; and
   structural elements disposed on the surface of said substrate and arranged periodically in a propagating direction of surface acoustic waves, wherein:
   said structural elements are thin films disposed on the surface of said substrate and arranged at periodic intervals of $\lambda_0$ as electrode fingers in the propagating direction of surface acoustic waves,
   said first and second electrode fingers are arranged at periodic intervals of $\lambda_0/2$ as electrode fingers, and
   one of said first and second electrode fingers have at least portions thereof overlapping with said thin films.

13. The surface acoustic wave transducer according to claim 12, wherein each of said thin films has a width of $\lambda_0/2$, each of said electrode fingers has a width of $\lambda_0/4$, and respective central positions of said thin films and respective central positions of said ones of the first and second electrode fingers associated respectively with said thin films are spaced from each other by a distance of $\lambda_0/8$ in the propagating direction of surface acoustic waves.

14. The surface acoustic wave transducer according to claim 12, wherein each of said thin films has a width in a range from $0.25\lambda_0$ to $0.75\lambda_0$, each of said thin films has a thickness in a range from $0.001\lambda_0$ to $0.3\lambda_0$, each of said electrode fingers has a width in a range from $0.05\lambda_0$ to $0.5\lambda_0$, each of said electrode fingers has a film thickness in a range from $0.001\lambda_0$ to $0.3\lambda_0$, and respective central positions of said thin films and respective central positions of said one of the first and second electrode fingers associated respectively with said thin films are spaced from each other by a distance in a range from $-0.25\lambda_0$ to $0.25\lambda_0$ in the propagating direction of surface acoustic waves.

15. The surface acoustic wave transducer according to claim 12, wherein said substrate, said ones of the first and second electrode fingers, and said thin films are stacked in this order in regions where said ones of the first and second electrode fingers and said thin films overlap each other.

16. The surface acoustic wave transducer according to claim 12, wherein said substrate, said thin films, and said ones of the first and second electrode fingers are stacked in this order in regions where said ones of the first and second electrode fingers and said thin films overlap each other.

* * * * *